(12) United States Patent
Tsunemi (10) Patent No.: US 6,392,523 B1
(45) Date of Patent: May 21, 2002

(54) SURFACE-MOUNTING-TYPE COIL COMPONENT

(75) Inventor: Masayoshi Tsunemi, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/664,002

(22) Filed: Sep. 18, 2000

Related U.S. Application Data (63) Continuation-in-part of application No. 09/236,384, filed on Jan. 25, 1999, now Pat. No. 6,157,283.

(51) Int. Cl.⁷ .............................. H01F 27/29; H01F 5/00
(52) U.S. Cl. ....................... 336/192; 336/200; 336/223; 336/83; 336/96
(58) Field of Search ................................. 336/192, 200, 336/96, 83, 223

(56) References Cited

U.S. PATENT DOCUMENTS

| | | | | |
|---|---|---|---|---|
| 3,585,553 A | * | 6/1971 | Muckelroy et al. | ......... 336/192 |
| 4,777,461 A | * | 10/1988 | Sakamoto | .................... 333/184 |
| 5,530,416 A | * | 6/1996 | Wakamatsu et al. | ........ 336/192 |
| 5,680,087 A | * | 10/1997 | Sakata et al. | ................. 336/83 |
| 5,719,547 A | * | 2/1998 | Kaneko et al. | ............. 336/180 |

* cited by examiner

Primary Examiner—Anh Mai
(74) Attorney, Agent, or Firm—Townsend & Banta (57) ABSTRACT

A super-thin surface-mounting-type coil component, for mounting on a hybrid IC such as a DC-DC converter, is provided. Such a surface-mounting-type component comprises a core having a flat core portion in which the ratio of thickness to width (t/w) is not greater than 1/3, flange portions extending from both ends of the core portion in a longitudinal direction to be integrated with the core portion, two or four electrode layers spacedly positioned apart from each other and formed on peripheral portions, including side surfaces of the flange portions in at least a vertical direction, of the flange portions of the core. A winding is wound on the core portion of the core, having both ends obliquely led from the side surfaces of the flange portions and conductively fixed to the electrode layers of the side surfaces by thermocompression bonding.

15 Claims, 6 Drawing Sheets

PRIOR ART

FIG. 7

PRIOR ART

FIG. 8a

PRIOR ART

FIG. 8b

SURFACE-MOUNTING-TYPE COIL COMPONENT

This application is a continuation-in-part application of parent application Ser. No. 09/236,384, filed Jan. 25, 1999, now U.S. Pat. No. 6,157,283.

BACKGROUND OF THE INVENTION

1. Field of the Invention

The present invention relates to a novel super-thin surface-mounting-type coil component suitably mounted on a hybrid IC, such as a DC-DC converter.

2. Background of the Invention

To achieve reductions in the thickness and size of an electric device such as a portable information terminal, a popular method of mounting a so-called hybrid IC in which electronic components such as capacitors, transistors, transformers, and an IC consisting of a package of a block circuit such as a DC-DC converter, is used. Such a method involves integration of said components by surface-mounting such components on one sub-substrate, said sub-substrate being mounted on a mother substrate.

Respective electronic components of the hybrid IC are required to be reduced in size and thickness (in height). In particular, the reduction in height of a coil component (transformer, choke coil or the like) is very important and in strong demand.

For example, a surface-mounting-type transformer serving as a typical surface-mounting-type coil component has a structure in which a primary winding and a secondary winding are separately wound on a resin coil bobbin, a frame lead line being built into a side or bottom surface of the coil bobbin, both the ends of which are wounded on the frame read terminal and conductively fixed thereto by soldering, and wherein a magnetic core is fitted in the coil bobbin. However, the minimum achievable height of the coil bobbin is a about 3 mm, which is insufficient.

Figure 6:
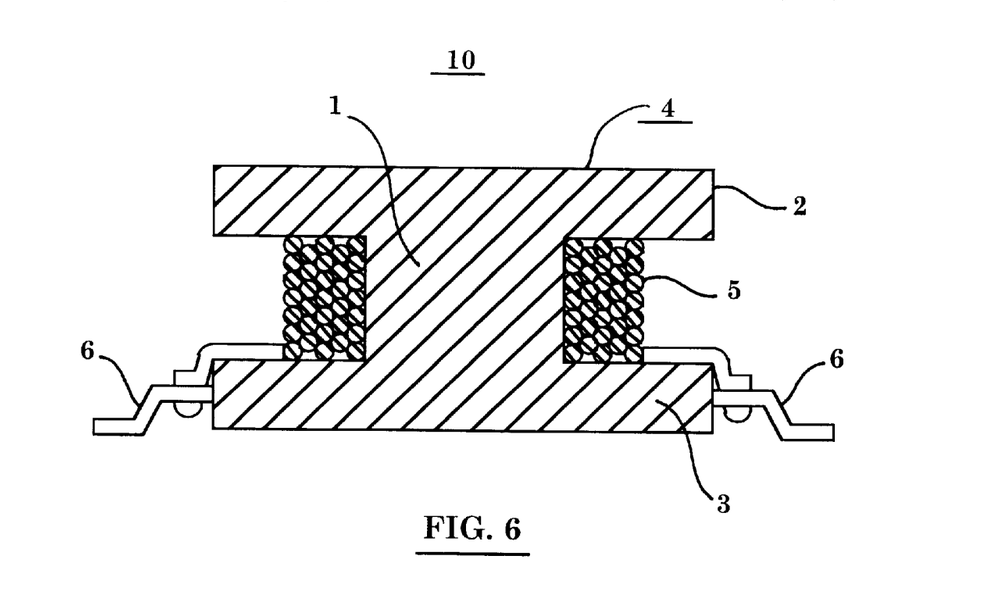
FIG. 6 is a longitudinal cross-sectional view of a conventional surface-mounting-type transformer.

Therefore, as a structure which is reduced in size and height, as shown in FIG. 6, a coil bobbin is omitted, and an insulator-coated conductive line is directly wound on a vertical drum ferrite core 4, the drum ferrite core being composed of a vertical shaft consisting of a core portion 1 and flange portions 2 and 3 integrally extending from both the ends of the core portion 1 in the longitudinal direction to form a winding 5. In the surface-mounting-type transformer 10, the ends of the winding are wound on a narrow-band-shaped lead terminal 6, obtained by press-shaping a metal plate built in the flange portion 3, and soldered on the lead terminal 6.

Figure 7:
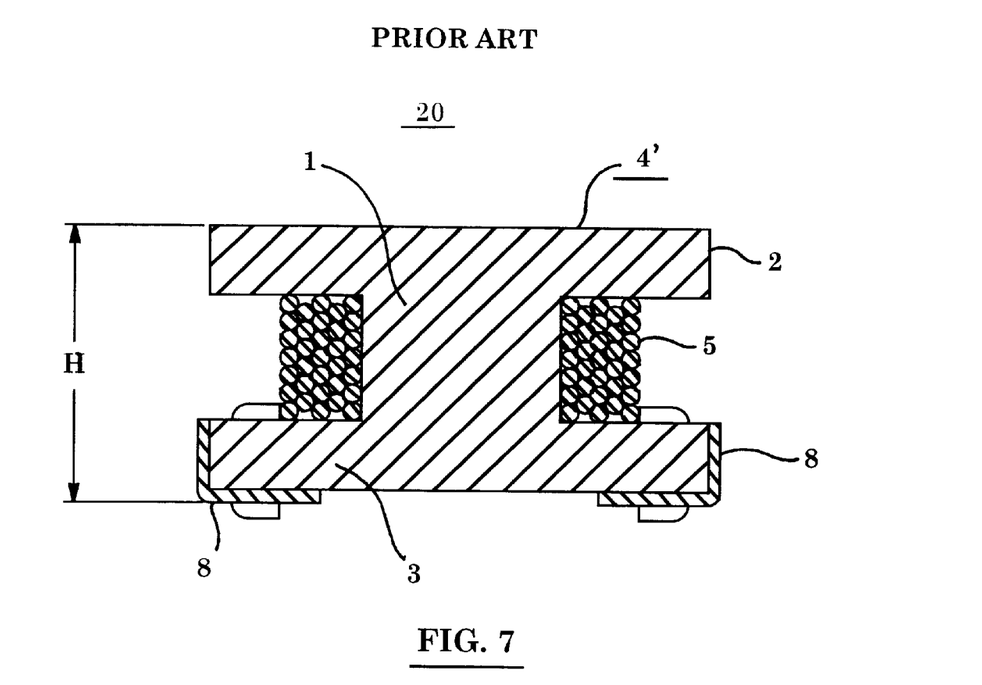
FIG. 7 is a longitudinal cross-sectional view of another type of conventional surface-mounting-type transformer.

As shown in FIG. 7, a surface-mounting-type transformer 20 has an electrode layer 8 obtained by directly printing a conductive paste or the like on the bottom surface and peripheral surface of the flange portion 3 of a vertical drum ferrite core 4' to be fixed thereto, which is arranged in place of the lead terminal 6 described above. The end of the winding 5 is conductively fixed to the electrode layer 8 through a lead groove (not shown).

Figure 8A:
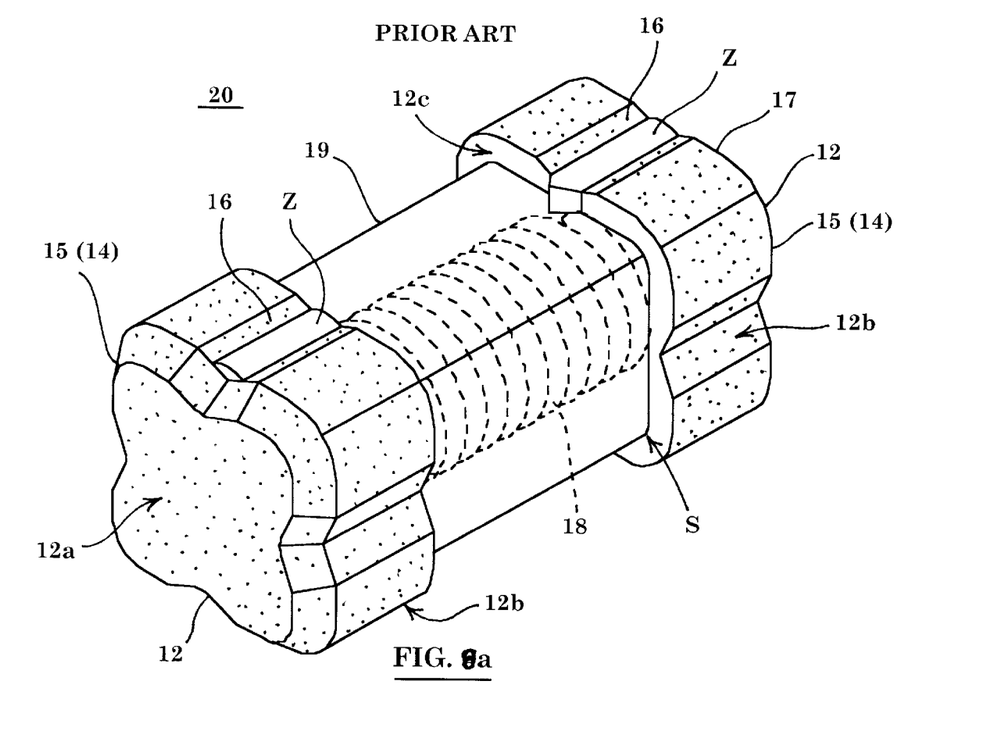
FIG. 8 is a perspective view of a conventional surface-mounting-type transformer.
Figure 8B:
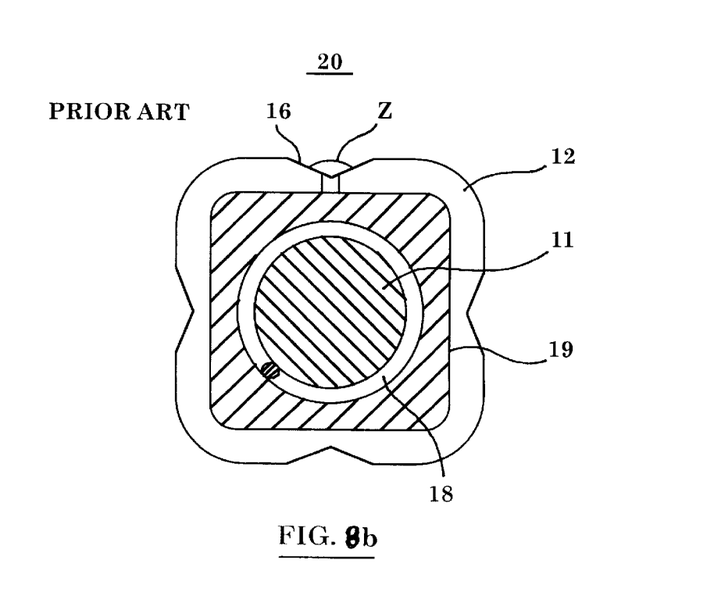

As shown in FIG. 8, another type of surface-mounting-type transformer 30 has electrode layers 21 directly mounted on a core by printing on end faces 16 and 17 and bottom surfaces 18 and 19 of rectangular flange portions 12 and 13 of horizontal ferrite core 15, in which the rectangular flange portions 12 and 13 are integrally formed on both the right and left ends of a rectangular-parallelopiped core portion 11 (indicated by a broken line). The ends of a winding 22 wound on the core portion 11 are conductively fixed to the end faces 16 and 17 of the electrode layers 21 by soldering.

Presently, such a surface-mounting-type transformer 20, as shown in FIG. 7, using the vertical drum ferrite core 4' has a minimum height H=1.6 mm. In the surface-mounting-type transformer 30 using the horizontal ferrite core 15, as shown in FIG. 8, as it is very difficult to withdraw the end of the winding 22 within the dimension of the electrode layer 21, the withdrawn portion of the winding or a conductive fixed portion swelled by soldering tends to protrude beyond the outside dimensions of the transformer. Therefore, while utilizing this type of structure, it is impossible to reduce the size and height of the transformer.

In addition, when conductively fixing the end of the winding by soldering, the flange portions 12 and 13 of the conductively fixed portions occupy a large area in the electrode layer 21. In addition, heat generated by soldering is transmitted to the core portion 11, adversely affecting the coil component by heat degradation of the insulating property of the winding 22.

In a hybrid IC, when the surface-mounting-type transformer 30 using the horizontal ferrite core 15 is mounted on a substrate, a leakage magnetic flux acts on a wiring pattern on a surface opposing the mounted surface, disadvantageously decreasing the inductance value. In addition, insulation between the electrode layer 21 and the wiring pattern of the mother substrate is specially required, increasing the production time and cost of manufacture.

SUMMARY OF THE INVENTION

The present invention has been made in consideration of the above circumstances and, therefore, the object of the present invention is to provide a structure in which the height of a surface-mounting-type coil component is further reduced by using a novel horizontal flat core and an improved conductively fixed portion between a winding and an electrode layer.

According to the present invention, the first object is to reduce the size and height of the surface-mounting-type coil component, as described above. In order to achieve this object, the prior art surface-mounting-type transformer 30 having horizontal ferrite core 15, and shown in FIGS. 6–8 must be flattened, i.e., a flat core must be obtained.

In this case, a flat core according to the present invention is defined as a core which satisfies the condition in which the ratio t/w of the thickness t to width w of the flat core portion 31 of the ferrite core 35 of the surface-mounting-type transformer 50 is not greater than 1/3. A conventional flat core cannot satisfy this condition.

The present invention achieves the above object by providing:

(1) a surface-mounting-type coil component comprising a core having a flat core portion in which the ratio of thickness to width (t/w) is not greater than 1/3, flange portions extending from both ends of the core portion in a longitudinal direction to be integrated with the core portion, two or four electrode layers spacedly positioned apart from each other and formed on peripheral portions, including side surfaces of the flange portions in at least a vertical direction, of the flange portions of the core; and a winding wound on the core portion of the core and having both ends which are obliquely led from the side surfaces of the flange portions and conductively fixed to the electrode layers of the side surfaces by thermo-compression bonding.

(2) A second embodiment of the present invention provides a surface-mounting-type coil component according to the first embodiment (1) above, wherein the end of the winding on at least one winding-end side is conductively fixed to the electrode layer of the side surface of the flange portion of the core on an extension of the thickness of the core portion.

(3) In a third embodiment, a surface-mounting-type coil component is provided according to either the first or second embodiment above, wherein a height H of the flange portion of the core is not more than 1.6 mm, and a line diameter of the winding ranges from 30 µm to 150 µm.

(4) In a fourth embodiment, a surface-mounting-type coil component is provided according to either the first or second embodiment above, wherein the thickness of the electrode layer in contact with a fixed portion of the end of the winding is not more than the line diameter of the winding.

(5) In a fifth embodiment, a surface-mounting-type coil component is provided according to either the first or second embodiment, wherein a gap region, in which there is no electrode layer, is formed near the core portion on the peripheral portion of the flange portion of the core having the electrode layer formed thereon.

(6) In a sixth embodiment, a surface-mounting-type coil component is provided according to either the first or second embodiment, wherein a fixed portion of the winding on the electrode layer has a wide portion having a width 1.5 to 4.0 times the line diameter of the winding.

(7) In a seventh embodiment, a surface-mounting-type coil component is provided according to either the first or second embodiment, wherein the electrode layer is formed in a recessed groove formed in the side surface of the flange portion of the core, and a fixed portion of the end of the winding on the electrode layer is accommodated in the recessed groove.

(8) In an eighth embodiment, a surface-mounting-type coil component is provided according to either the first or second embodiment, wherein a magnetic-powder-contained resin layer is formed on a surface in a continuous manner, on a mounting substrate side, of the winding wound on the core portion.

DETAILED DESCRIPTION OF THE INVENTION

A surface-mounting-type coil component according to an embodiment of the present invention will be described below in detail, with reference to the components shown in FIGS. 1 to 5.

Although surface-mounting-type coil components include various components such as a transformer, a choke coil, and a filter, these components have the same structure except for the number of electrode layers serving as external connection terminals and the number of windings. For this reason, in this embodiment, a surface-mounting-type transformer will be described below as a typical component.

Figure 3:
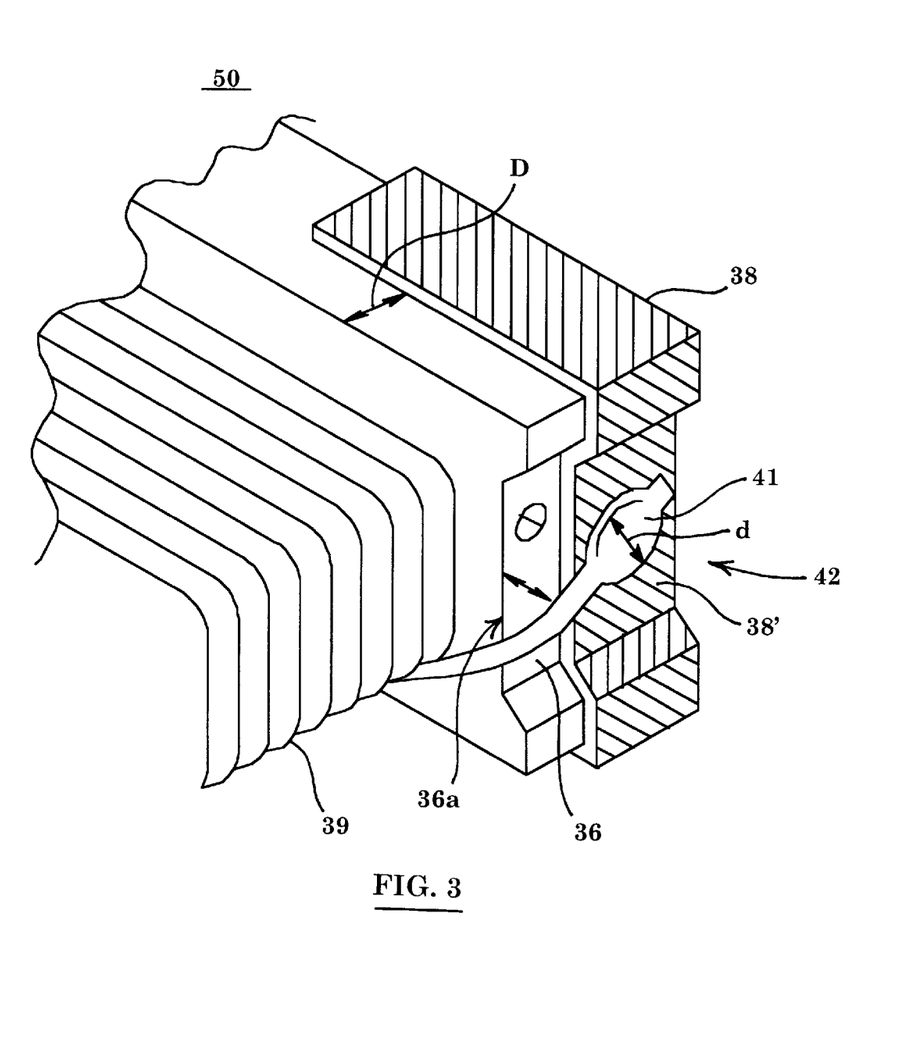
FIG. 3 is a cutaway perspective view of the surface-mounting-type transformer according to the present invention, showing a conductively fixed portion on a side end face of a flat ferrite core.

A surface-mounting-type transformer 50, as shown in FIGS. 1 to 5, comprises a ferrite core 35 having a flat core portion 31 in which the ratio of thickness t to width w (t/w) is not greater than 1/3, and flange portions 32 and 33 extending from both the ends of the core portion 31 in a longitudinal direction, to be integrated with the core portion 31. Four electrode layers 38 are spacedly positioned apart from each other and formed on peripheral portions, including side surfaces 36, of the flange portions 32 and 33. A winding 39 is wound around the core portion 31 of the ferrite core 35, both ends of the winding 39 leading to the side surfaces 36 of the flange portions, as shown in FIG. 3, and conductively fixed to electrode layer portions 38' of the side surfaces 36 by thermo-compression bonding.

Conventionally, thermo-compression bonding of the winding to the electrode layer deforms and widens the winding, which loosens the winding around the core. This loosened winding increases the outer profile of the coil structure. The present invention solves this problem by leading the winding aslant to the side surface of the flange portion of the core, which decreases the loosening effect of the thermo-compression bonding.

Figure 1:
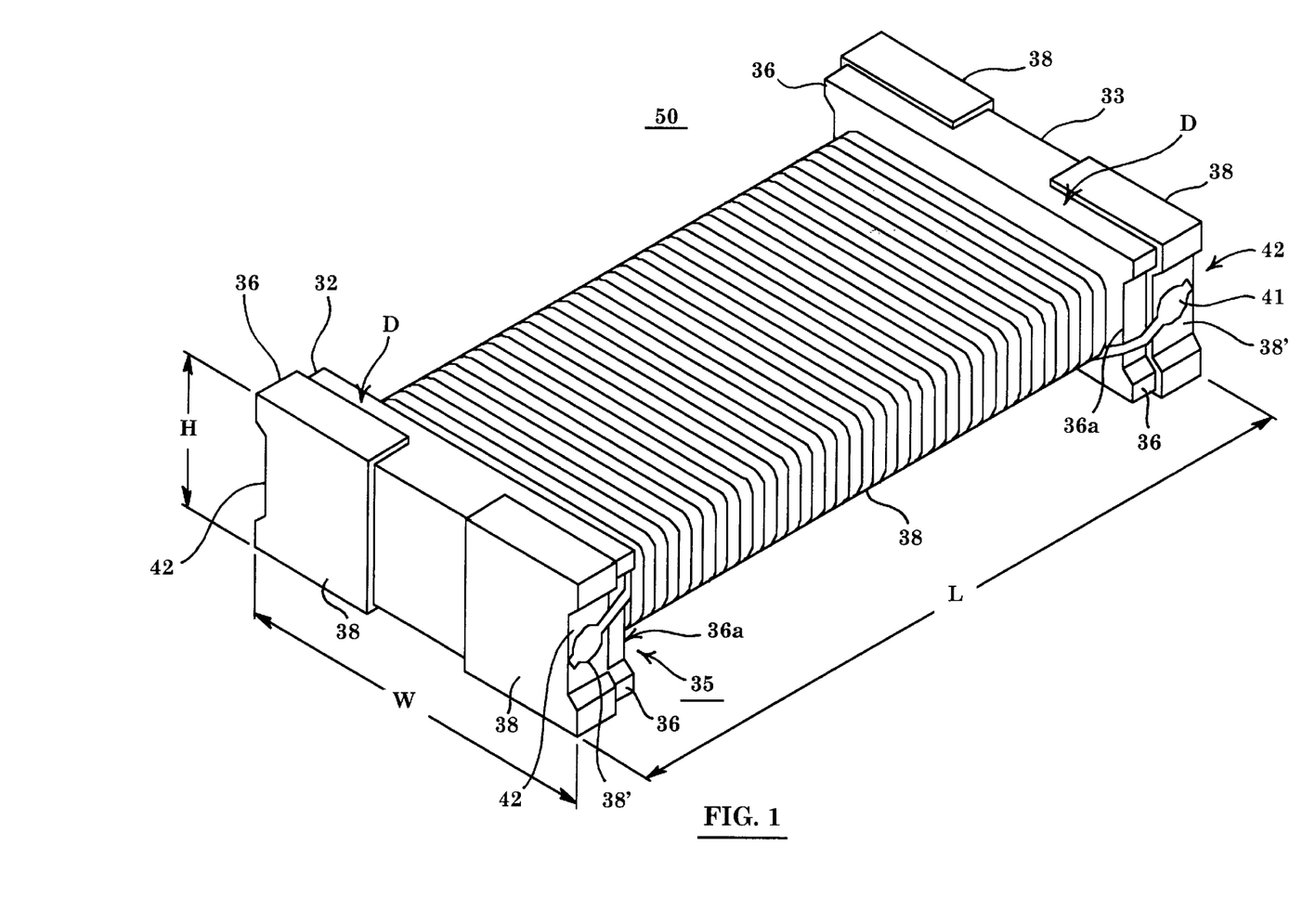
FIG. 1 is a perspective view of the surface-mounting-type transformer according to the present invention.
Figure 2:
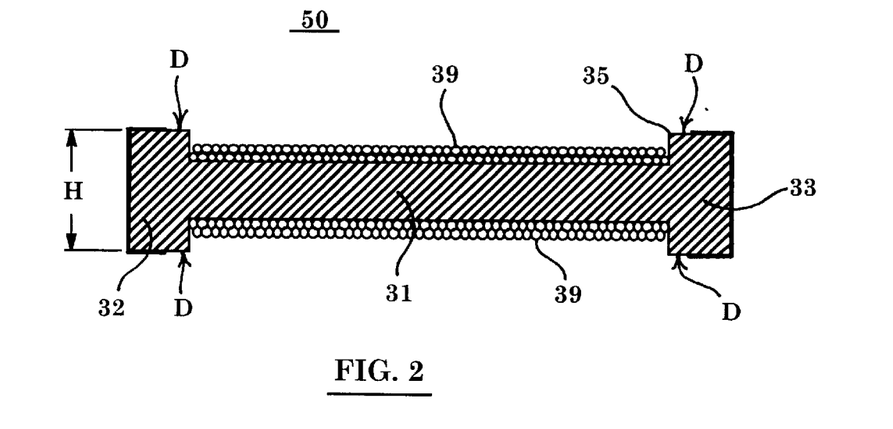
FIG. 2 is a front cross-sectional view of the surface-mounting-type transformer according to the present invention.

Referring to the compound shown in FIG. 1, the entire width w is 3.6 mm, and the longitudinal dimension L of the winding axis is about 5.5 mm. In contrast, the height H is only about 1.2 mm.

It was unexpectedly discovered that if the ratio t/w is not greater than 1/3, and the winding is conductively fixed to the side surface of the flanges via electrode layers thereon, a thin, flat coil can be obtained having desirable insulating properties. This ratio, which is not found in conventional coil structures, is critical to obtaining the thin structure desired.

In addition, it was found that interposition of a magnetic-coated powder resin layer between the substrate and the winding prevents undesirable leakage magnetic flux. With these discoveries, it was possible for the present inventors to obtain a very-compact, extremely-flat surface-mounting-type transformer.

The above novel structure provides a considerable reduction in height compared with the surface-mounting-type transformer 20 of the prior art using the vertical drum ferrite core 4, as shown in FIG. 7. The winding 39 is conductively connected to the electrode surface portions 38' of the vertical side surfaces 36 of the flange portions 32 and 33 of the flat ferrite core 35 by thermo-compression bonding. Therefore, the withdrawn portion and the conductively fixed portion of the winding 39 do not contribute to the height of the product, making it possible to attain a surface-mounting-type coil component having an extremely small height, i.e., a height H suppressed to about 1.2 mm. Moreover, it is believed that, in the future, it will be possible to achieve a height H of only about 0.8 mm.

The ends of the winding 39 are conductively fixed by thermo-compression bonding to the electrode surface portions 38' of the vertical side surfaces 36 of the flange portions 32 and 33, which are furthest from the core portion 31 having the winding 39 wound thereon. For this reason, heat is rarely transmitted to the core portion 31, thereby protecting the winding 39 from heat damage.

Figure 4A:
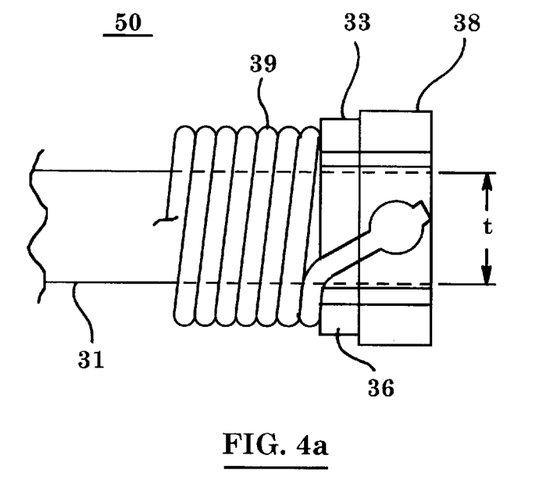
FIG. 4(a) is an enlarged side view, cut-away, of the surface-mounting-type transformer of the present invention, showing a conductively fixed portion of a winding on the side surface of a flange portion of the ferrite core.
Figure 4B:
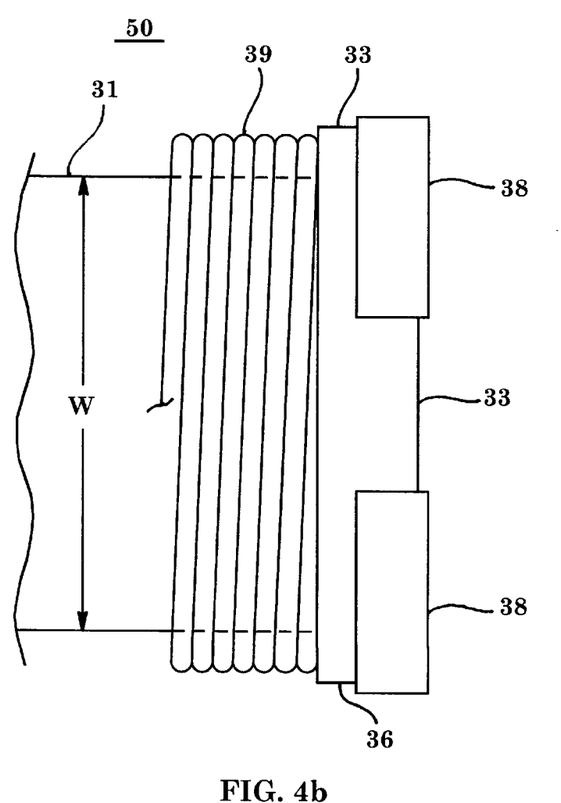
FIG. 4(b) is a plan view, cutaway, of the surface-mounting-type transformer of the present invention, showing a conductively fixed portion of a winding on the side surface of a flange portion of the ferrite core.

An important feature of the surface-mounting-type transformer 50 is that, as shown in FIG. 4(a) especially, the conductively fixed portion of the end of the winding 39 is located on the side surface 36 of the winding-end side of an extension of the electrode layer 38 of the flange portion 33, not adding to the thickness of the flat core portion 31. The conductively fixed portion is particularly located within the above range t on the side surface 36 of the flange portion 33. In such a structure, if the withdrawn portion located on the winding-end side of the winding wound on the flat core portion of the core is loosened by extension of the winding caused by thermo-compression bonding, extrusion of the winding out of the range of the height is suppressed, providing the advantage that the height of the coil component is not easily adversely affected.

In the surface-mounting-type transformer 50 described above, according to the studies of the present inventor, it has been found that the line diameter of the winding 39 preferably ranges from 30 µm to 150 µm when the height H is about 1.6 mm or less. It is believed that when using a winding having a line diameter exceeding the above range, the necessary heat required for thermo-compression bonding is excessive, which adversely affects the insulating reliability of the wiring. When the line diameter is too small, the conductively fixed portion in thermo-compression bonding does not attain sufficient tensile strength.

In addition, in the surface-mounting-type transformer 50, it is preferable that the thickness of the electrode layer 38' being in contact with a conductively fixed portion 41 of the end of the winding 39 is equal to or smaller than the line diameter of the winding 39. It is believed that when thermo-compression bonding is used for a conductively fixing means, the end of the winding 39 sinks into the electrode layer 38' to some extent when the end of the winding 39 collapses. However, in this case, a sufficient pressure acts on the end of the winding, so that the end can be reliably conductively fixed to the electrode layer 38'.

In the surface-mounting-type transformer 50 of the present invention, since a horizontal flat ferrite core 35 is used, the insulating properties between an external pattern and the winding 39, as well as the influence of a leakage magnetic flux, must be taken into consideration.

In the surface-mounting-type transformer 50, as shown in FIG. 1, a gap region D, in which the electrode layer 38 is not formed, is formed near the flat core portion 31 on the peripheral surface of the flange portion 32 of the ferrite core 35 to which the electrode layer 38 is affixed by printing. Even if the winding 39 comes into close proximity with the edges of the peripheral surfaces of the flange portions 32 and 33 due to a large number of turns, a distance remains between the winding 39 and the electrode layer 38, due to the presence of the gap region D. Therefore, desirable insulating properties can be maintained.

As shown in FIG. 3, thermo-compression bonding (e.g., spot welding) is performed such that the conductively fixed portion 41 of the winding 39 on the electrode layer 38 has a wide portion having a width d of 1.5 to 4.0 times the line diameter of the winding, thereby obtaining sufficient connection strength. An end portion of winding 39 is obliquely fixed to a small, narrow side end face 36 having a height H of 1.2 mm (i.e., an angle θ between the winding 39 and an edge 36a of the side end face 36 is an acute angle ranging from 20° to 60°), and the size of the fixing area by spot welding can be increased by conductively affixing the end of the winding 39 to the electrode layer 38.

Furthermore, in the surface-mounting-type transformer 50 shown in FIGS. 1 and 3, the electrode layers 38' are affixed to the transformer by printing in recessed grooves 42 formed on the side surfaces 36 of the flange portions 32 and 33 of the ferrite core 35, and the conductively fixed portions 41 between the ends of the winding 39 and the electrode layer 38' are accommodated in the recessed grooves 42. In this manner, the conductively fixed portions 41 are completely accommodated in the recessed grooves 42, thereby allowing the outside dimensions of the transformer to be unaffected, as well as preventing the conductively fixed portion 41 from coming into contact with other electronic components.

The periphery of the conductively fixed portion 41 is desirably covered with a resin or the like to obtain insulating protection, as well as to further affix the conductively fixed portion 41.

Figure 5:
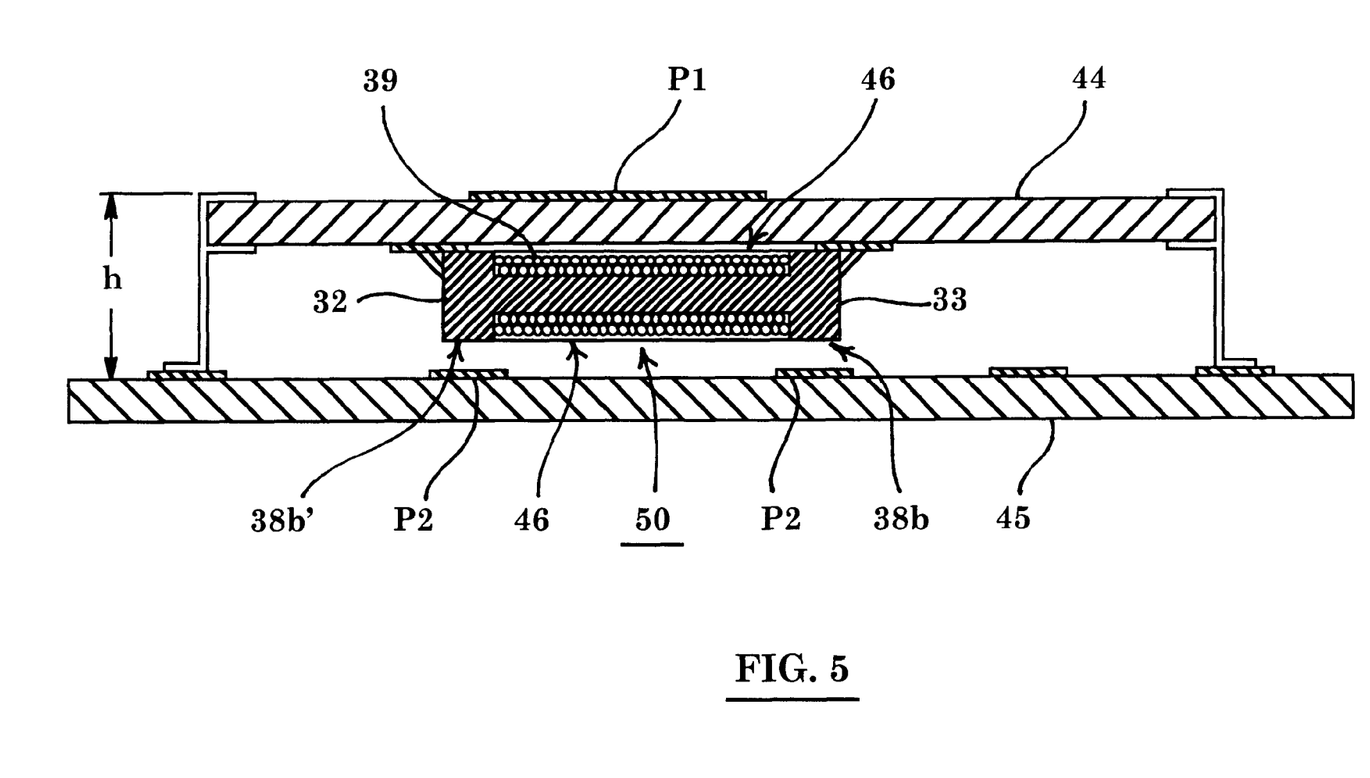
FIG. 5 is a longitudinal cross-sectional view of the surface-mounting-type transformer of the present invention, showing a state wherein a hybrid IC, obtained by mounting the surface-mounting-type transformer according to the present invention on a sub-strate, is mounted on a mother substrate.

As shown in FIG. 5, with a surface-mounting-type transformer 50 mounted on a sub-substrate 44 of the hybrid IC, an inductance value may be lowered by the influence of a leakage magnetic flux caused by a wiring pattern Pi formed on the opposite surface of the sub-substrate 44. To counteract this influence, a magnetic-powder-contained resin layer 46 (a resin film or a resin plate coated on the surface of the winding 39) is interposed between the sub-substrate 44 of the hybrid IC and the surface of the winding 39 of the mounted surface-mounting-type transformer 50, preventing the such an undesirable leakage magnetic flux, and protecting the winding 39.

In addition, when the flat resin layer 46 is also formed on the surface of the winding on the mother substrate 45 side, insulating protection or the like between the winding 39 and the electronic components on the mother substrate or a wiring pattern P2, and improved adsorptivity in mount adsorption by an automatic mounter, can also be obtained.

The material of the core of the component of the present invention is not limited to a specific material. However, in a preferable embodiment, a ferrite core 35 composed of material having a high resistivity, such as a nickel-zinc-based ferrite, a nickel-zinc-copper-based ferrite, or the like, is used. The outside dimensions of the ferrite core 35 are set in consideration of the physical strength of the ferrite, such that a height H (heights of the flange portions 32 and 33)=0.5 mm to 1.6 mm with respect to a width w=3.6 mm, and the height (thickness) of the flat core portion 31 ranges from 0.3 mm to 0.8 mm. The ratio of the width w to the thickness t of the flat core portion 31 is 3 or more, preferably, 5 or more. In addition, an appropriate longitudinal dimension L, such as about 5.5 mm in the surface-mounting-type transformer 50 shown in FIG. 1, is used.

The electrode layers 38 can be easily formed by integrally printing and baking on the left and right sides of the peripheral surface, and a conductive paste containing silver powder and glass frit is affixed to the end face of each of the flange portions 32 and 33, the conductive paste being divided. As a matter of course, the conductive paste may be printed and affixed to the left and right sides independently, and a printing method by transfer can also be employed.

In addition, if necessary, a plating process, such as solder plating or copper plating, may be performed on the surface of the electrode layers 38. As shown in FIG. 5, for insulation reasons, it is preferable to place the electrode wiring portion 38*b* between the mother substrate 45 and the wiring pattern, such that an electrode wiring portion 38*b* is positioned on the peripheral surfaces of the flange portions 32 and 33.

In the surface-mounting-type coil component represented by the surface-mounting-type transformer 50 according to the present invention, as described above, it is preferable that the height H be 1.6 mm or less, more preferably about 1.2 mm. In the future, it is believed that the height H of the surface-mounting-type coil component can be reduced to about 0.8 mm. For example, as shown in FIG. 5, the thickness h of the hybrid IC in which the surface-mounting-type transformer 50 is mounted on the mother substrate 45 is about 1.8 mm or less.

Since the surface-mounting-type transformer 50 according to the present invention has a height equal to that of a thin IC, the surface-mounting-type transformer 50 is directly mounted on the mother substrate 45, allowing the mother substrate to be uniformly reduced in height.

By providing a surface-mounting-type coil component according to the present invention as described above, the following advantages are achieved:

(1) The height of the surface-mounting-type coil component can be reduced to 1.6 mm, and the surface-mounting-type coil component can be suitably mounted on a hybrid IC.

(2) The end of the winding is reliably thermo-compression-bonded onto the electrode layer on the side surface of the flange portion of the core. Therefore, projection of the winding beyond the outside dimensions of the component is prevented by thermo-compression bonding of the winding.

(3) Precise conditions for the line diameter of the winding in conductive fixing of the winding to the electrode layer by thermo-compression bonding are attained.

(4) The distance between the winding wound on the core portion and the electrode layer can be maintained by a gap region, thereby maintaining preferable insulating properties.

(5) When the fixed portion of the winding has a wide portion having a width 1.5 to 4.0 times the line diameter of the winding, a thermo-compression bonding region on the electrode layer is sufficiently assured, and a reliable connection of the conductively fixed portion is achieved.

(6) Since the conductively fixed portion is accommodated in a recessed groove in the side surface of the flange portion of the core, the conductively fixed portion does not project beyond the outside dimensions of the component, thereby allowing the outside dimensions of the component to be kept to a minimum.

(7) Preferable insulating properties between the mother substrate and the sub-substrate of the hybrid IC are attained, as well as a high level of safety during operation.

What is claimed is:

1. A surface-mounting-type coil component comprising:
    a core having a flat core portion in which a ratio t/w of a thickness t to a width w is not more than 1/3, and flange portions extending from both ends of said core portion in a longitudinal direction to be integrated with said core portion;
    two or four electrode layers being formed by printing or baking which are spacedly positioned apart from each other and formed on peripheral portions, including side surfaces of said flange portions in at least a vertical direction, of said flange portions of said core; and
    a winding having two ends wound on said core portion of said core,
    wherein said winding has both ends obliquely led aslant to the side surfaces of said flange portions and conductively fixed to said electrode layers on the side surfaces of said flange portions by thermo-compression bonding-the withdrawn portion located on the winding-end side of the winding wound on the flat core portion of the core loosened by extension of the winding caused by thermo-compression bonding.

2. A surface-mounting-type coil component according to claim 1, wherein a magnetic-powder contained-resin layer is levelly formed on a surface, on a mounting substrate side, of said winding wound on said core portion.

3. A surface-mounting-type coil component according to claim 1, wherein a height H of said flange portion of said core is not more than 1.6 mm, and a line diameter of said winding ranges from 30 $\mu$m to 150 $\mu$m.

4. A surface-mounting-type coil component according to claim 1, wherein a thickness of said electrode layer being in contact with a fixed portion of the end of said winding is not more than a line diameter of said winding.

5. A surface-mounting-type coil component according to claim 1, wherein a gap region in which said electrode layer is not formed is formed near said core portion on the peripheral portion of said flange portion of said core having said electrode layer formed thereon.

6. A surface-mounting-type coil component according to claim 1, wherein a fixed portion of said winding on said electrode layer has a wide portion having a width 1.5 to 4.0 times a line diameter of said winding.

7. A surface-mounting-type coil component according to claim 1, wherein said electrode layer is formed in a recessed groove formed in the side surface of said flange portion of said core, and a fixed portion of the end of said winding on said electrode layer is accommodated in said recessed groove.

8. The surface-mounting-type coil component of claim 1, wherein a conductive paste containing silver powder and glass frit is affixed to the end face of each of the flange portions.

9. The surface-mounting-type coil component of claim 8, wherein the conductive paste is affixed to the end face of each of the flange portions by printing.

10. A surface-mounting-type coil component according to claim 1, wherein the end of said winding on at least a winding-end side is conductively fixed to said electrode layer of the side surface of said flange portion of said core on an extension of the thickness of said core portion.

11. A surface-mounting-type coil component according to claim 10, wherein a gap region in which said electrode layer is not formed is formed near said core portion on the peripheral portion of said flange portion of said core having said electrode layer formed thereon.

12. A surface-mounting-type coil component according to claim 10, wherein a fixed portion of said winding on said electrode layer has a wide portion having a width 1.5 to 4.0 times a line diameter of said winding.

13. A surface-mounting-type coil component according to claim 10, wherein a magnetic-powder contained-resin layer is levelly formed on a surface, on a mounting substrate side, of said winding wound on said core portion.

14. A surface-mounting-type coil component according to claim 10, wherein a height H of said flange portion of said core is not more than 1.6 mm, and a line diameter of said winding ranges from 30 µm to 150 µm.

15. A surface-mounting-type coil component according to claim 10, wherein a thickness of said electrode layer being in contact with a fixed portion of the end of said winding is not more than a line diameter of said winding.

* * * * *